(12) United States Patent
Yamamoto

(10) Patent No.: US 6,914,667 B2
(45) Date of Patent: Jul. 5, 2005

(54) EXPOSURE APPARATUS AND PURGING METHOD FOR THE SAME

(75) Inventor: Sumitada Yamamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/722,483

(22) Filed: Nov. 28, 2003

(65) Prior Publication Data

US 2004/0160584 A1 Aug. 19, 2004

(30) Foreign Application Priority Data

Nov. 29, 2002 (JP) ...................................... 2002-347729

(51) Int. Cl.[7] .............................................. G03B 27/42
(52) U.S. Cl. .............................. 355/53; 355/67; 355/77
(58) Field of Search ............................. 355/30, 53, 55, 355/67, 77; 430/5, 30, 311; 250/492.1, 492.2

(56) References Cited

U.S. PATENT DOCUMENTS

2002/0000519 A1 * 1/2002 Tsukamoto .............. 250/492.1
2002/0057422 A1 * 5/2002 Arakawa ...................... 355/67

FOREIGN PATENT DOCUMENTS

JP 2-210813 8/1990
JP 6-216000 8/1994

* cited by examiner

*Primary Examiner*—D. Rutledge
(74) *Attorney, Agent, or Firm*—Fitzpatrick, Cella, Harper & Scinto (57) ABSTRACT

Disclosed is an exposure apparatus including an exposure light source, an optical system, a casing, a gas replacing system, and a control system. The optical system directs exposure light from the exposure light source to a photosensitive substrate. The casing accommodates therein at least one optical element of the optical system. The gas replacing system supplies a purge gas into the casing to replace a gas inside the casing with the purge gas. The control system controls the gas replacing system so as to increase a flow rate of the purge gas if a predetermined time elapses after an exposure is completed and before a next exposure starts.

4 Claims, 7 Drawing Sheets

EXPOSURE APPARATUS AND PURGING METHOD FOR THE SAME

FIELD OF THE INVENTION AND RELATED ART

This invention relates to an exposure apparatus and a purging method for the same, suitably applicable to an exposure apparatus for projecting a pattern of a mask onto a photosensitive substrate through a projection optical system, wherein short-wavelength laser light easily activating impurities and oxygen in an ambient environment is used as exposure light and wherein an exposure light passage inside the apparatus is replaced by an inactive gas. More particularly, the invention concerns a purge gas supply for supplying a purge gas such as inactive gas into a purge space of the exposure light passage, that accommodates optical components.

The procedure of manufacturing semiconductor devices, constituted by very fine patterns such as LSI or VLSI, includes the use of a reduction projection exposure apparatus for projecting, in a reduced scale, a circuit pattern formed on a mask onto a substrate, coated with a photosensitive material, thereby to print the pattern on the substrate. With the increasing packaging density of a semiconductor device, reduction of the pattern linewidth has been required more and more. Simultaneously with the advancement of the resist process, the resolving power of the exposure apparatuses has been improved to meet the reduction in linewidth.

The resolving power of the exposure apparatus can be improved by (i) shortening the exposure wavelength or (ii) enlarging the numerical aperture (NA) of the projection optical system.

As regards the exposure wavelength, the light beam that has been used has been changed from an i-line of 365 nm to a KrF excimer laser having a emission wavelength about 248 nm, and an ArF excimer laser having an emission wavelength about 193 nm is now practically available. Also, a fluorine ($F_2$) excimer laser having an emission wavelength about 157 nm is being developed.

However, in an exposure apparatus using exposure light of a wavelength shorter than i-line (wavelength $\lambda$=365 nm), it is known that, due to the shortened wavelength, the exposure light causes a photochemical reaction of impurities and oxygen in the air. This results in an inconvenience that the product of the reaction (blurring matters) adheres to glass materials to cause non-transparent "blur" of the glass materials. As regards the blurring matters, a typical example is ammonium nitrate $(NH_4)_2SO_4$ that can be produced when sulfurous acid ($SO_2$) absorbs light energy and is excited thereby so that is reacts with oxygen in the air (oxidation). The ammonium nitrate has a white tone and, if it adheres to the surface of an optical element such as a lens or a mirror, for example, it causes the "blur". As the exposure light is scattered and absorbed by such ammonium nitrate, the transmissivity of the optical system from the exposure light source to the photosensitive substrate decreases. Particularly, in a short-wavelength region of exposure light such as 248 nm or less, shorter than the i-line, such as a KrF excimer laser, the exposure light causes an intense photochemical reaction so that not only is the "blur" produced, but also, the exposure light simultaneously may cause a reaction of oxygen in the air to produce ozone. This results in a phenomenon that both residual oxygen and produced ozone absorb exposure light.

In order to avoid this, various methods for preventing contamination of optical components have been developed, such as by accommodating optical components such as a lens system of a light source or a projection lens system in a casing and by replacing the atmosphere inside the casing with a purge gas such as an inactive gas (nitrogen gas, for example), or any other gas having its impurities removed (see, e.g., Japanese Laid-Open Patent Application No. H2-210813 or H6-216000).

However, with increases in the repetition frequency of the laser emission, resulting from a recent wavelength-shortening of lasers, the illuminance has been increased and, therefore, the influence of only a small amount of impurities left in the purged space has become a problem. As the purging technology is established, the tightness of the purge space has been improved. It is now possible to suppress entry of an outside gas to a level close to zero. As regards the purge gas itself to be supplied into the purge space, a high-purity inactive gas is used. Regarding the pipe flow-passage for the gas, clean fluorine tubes or metal tubes are used to avoid a mixture of impurities very carefully.

However, even if the entry of outside gas is suppressed and high purity of supplied purge gas is kept, it is difficult to completely avoid a small amount of emission gas from components used in the purge space. The components to be used in the purge space are fully washed and subjected to heating treatment, thereby to remove oils, or the like, on its surface. However, to completely remove them is difficult to achieve. Further, in recent exposure apparatuses, many a driving mechanism is accommodated in an inactive gas purge space to accomplish various illumination conditions or deformed illumination. These mechanisms may include components such as resins, unsuitable for heating treatment. Also, in some portions, use of an adhesive agent is inevitable. It is known that emission gas is produced therefrom.

There is a tendency that the quantity of gases emitted from residual oils, resins or adhesive agents, is relatively large at the initial stage, and gradually decreases thereafter. Although the amount of emission gas from these components is small in terms of absolute quantity, due to recent shortening in wavelength of the exposure apparatus or increasing illuminance, over a long time period, the impurities contained in a small amount of gas may adhere to optical components to decrease the light transmissivity or reflectivity. In order to meet this, the flow rate of inactive gas to be supplied may be increased so as to assure that the emission gas is thoroughly emitted in a short time period (i.e., exhausted). By increasing the flow rate, the molecular weight of the emission gas to be removed from the component surface increases, so that fast exhaustion of the emission gas source is expected.

However, although the proportion (concentration) of impurities in the inactive gas can be reduced to a low level by increasing the inactive gas flow rate, since the amount of emission gas per unit time is large until the emission gas is thoroughly emitted, the molecular weight of impurities passing along the optical component surface increases. Therefore, if the exposure process is carried out in this situation, more impurities adhere to the optical component, thus accelerating deterioration of transmissivity.

SUMMARY OF THE INVENTION

It has been desired to quickly exhaust an emission gas source of internal components, while, keeping low, the speed of deterioration of optical components due to the gas emitted from the inside components or materials within a purge space.

In accordance with an aspect of the present invention to meet this objective, there is provided an exposure apparatus, comprising: an illumination optical system for illuminating an original with exposure light from an exposure light source; a projection optical system for projecting a pattern, formed on the original, onto a photosensitive substrate; a closed or approximately closed casing for accommodating therein at least one of the optical components disposed along a light path of the exposure light from the exposure light source to the photosensitive substrate; purge gas replacing means for supplying a predetermined purge gas into the casing to replace a gas inside the casing with the purge gas; and switching means for changing a supply amount of the purge gas between an exposure period and a non-exposure period.

With the provision of the switching means, between the exposure period and the non-exposure period, the amount of purge gas supply can be controlled separately. Thus, for example, the purge gas supply amount may be increased during the non-exposure period, to increase the flow rate of the purge gas passing along the inside component surface thereby to increase the molecular amount of emission gas to be removed from the component surface. Since the amount of emission gas (impurities) to be removed increases, the emission gas source can be exhausted in a shorter time period. On the other hand, during the exposure process, the purge gas flow rate may be decreased to a necessary and sufficient level. Because of the decreased flow rate, an absolute amount of emission gas from the components inside the purge area decreases, and the amount of impurities passing along the optical component surface per unit time decreases. Thus, adhesion of impurities onto the optical components during the exposure process can be minimized.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

The present invention can be applied to any known exposure apparatus if it is of the type that ultraviolet light is used as exposure light, a space inside the apparatus for passage of exposure light is covered by a casing, the inside space is replaced by an inactive gas, and a pattern of a mask is projected onto a photosensitive substrate by use of a projection optical system.

The exposure light to be used in an exposure apparatus of the present invention is not limited to ultraviolet light. The present invention is effective in an exposure apparatus that uses deep ultraviolet light, particularly, KrF excimer laser light having a wavelength about 248 nm, or any other excimer laser light having a shorter wavelength.

[First Embodiment]

Figure 1:
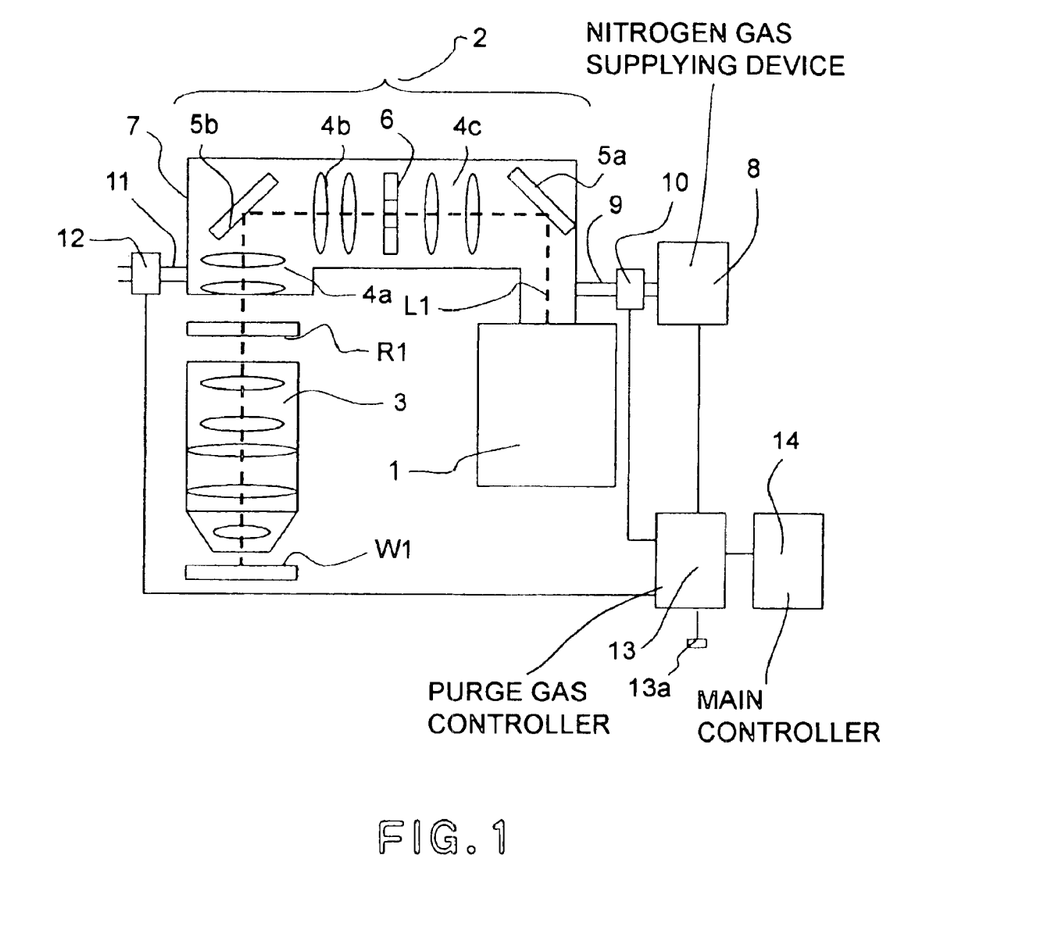
FIG. 1 is a schematic view for explaining the structure of an exposure apparatus according to a first embodiment of the present invention.

FIG. 1 illustrates an exposure apparatus according to a first embodiment of the present invention. In FIG. 1, denoted at 1 is a light source which comprises an excimer laser, and denoted at 2 is a light source lens system which is an optical system for shaping laser light L1, emitted from the light source 1, into a predetermined shape. Denoted at 3 is a projection lens system for imaging the laser light L1, shaped into a predetermined shape by the lens system 2, upon a wafer (substrate) W1 through a reticle R1.

The light source lens system 2 comprises optical elements such as different types of lens groups 4a, 4b and 4c and mirrors 5a and 5b, and it has a function for illuminating an illumination region on the reticle with the laser light L1 from the light source 1, with uniform illuminance. Also, it includes a sub-unit such as blind means 6 having a function for defining the shape (exposure view angle) of the illumination region on the reticle R1. The light source lens system 2 having such elements is accommodated inside a casing 7. Connected to this casing 7 is a nitrogen supplying device 8 for supplying nitrogen (inactive gas), that is connected through a nitrogen gas supply line 9 and a flow-rate controller 10 provided in the nitrogen gas supply line, for variably controlling the flow rate therethrough. There are a gas exhausting line 11 and an electromagnet valve 12, connected to a gas exhaust port.

The nitrogen gas supply device 8, the flow-rate controller 10 and the gas exhaust port electromagnet valve 12 are controlled by a purge gas controller 13. For supply of the purge gas into the casing 7, the gas exhaust port electromagnet valve 12 is opened to discharge the purge gas outwardly. When the supply of purge gas is unavailable due to stoppage of the equipment, or the like, the electromagnet valve 12 is closed to prevent entry of atmosphere from the outside. The purge gas controller 13 is connected to a main controller 14 that controls the whole exposure apparatus, and it receives information regarding the start and end of an exposure process in the exposure apparatus or information regarding the nitrogen supply state.

When the purge gas controller 13 receives a signal of exposure completion from the main controller 14, time measurement starts from that moment. When a signal of an exposure start is not applied even if a predetermined time that can be set arbitrarily is elapsed, the purge gas controller controls the flow rate controller 10 to increase the nitrogen flow rate. The amount of increase can be set arbitrarily, beforehand. When the purge gas controller 13 receives information of an exposure start, from the main controller 14, promptly it operates to decrease the nitrogen supply flow amount to a preset level. After a predetermined stand-by time until the impurity molecular weight inside the casing comes into a steady state, the main controller 14 starts the exposure.

In addition to the control of the nitrogen flow rate based on the information from the main controller 14, the purge gas controller 13 is provided with a manual change-over switch 13a. If it turns out beforehand that the exposure apparatus is held in a non-operational state for a long period due to the production schedule, without waiting for the elapse of the predetermined time, the nitrogen flow rate can be increased promptly by using this change-over switch 13a. Similarly, if the timing for starting the exposure apparatus being held in a non-operational state is predetermined, the switch 13a may be used to decrease the nitrogen flow rate, beforehand. In addition to the function for increasing/decreasing the flow rate instantaneously by its operation, the switch 13a is provided with a function for increasing/decreasing the nitrogen flow rate at a specified time. Thus, direct manual operation by an operator is unnecessary, at the moment whereat the nitrogen flow rate should be increased or decreased. In addition to the automatic flow-rate changing function, the nitrogen flow rate can be changed promptly by use of the switch 13a if the timing for operation or non-operation of the exposure apparatus is predetermined. Therefore, the stand-by time until the switching, involved in the automatic switching process, can be reduced.

Figure 2:
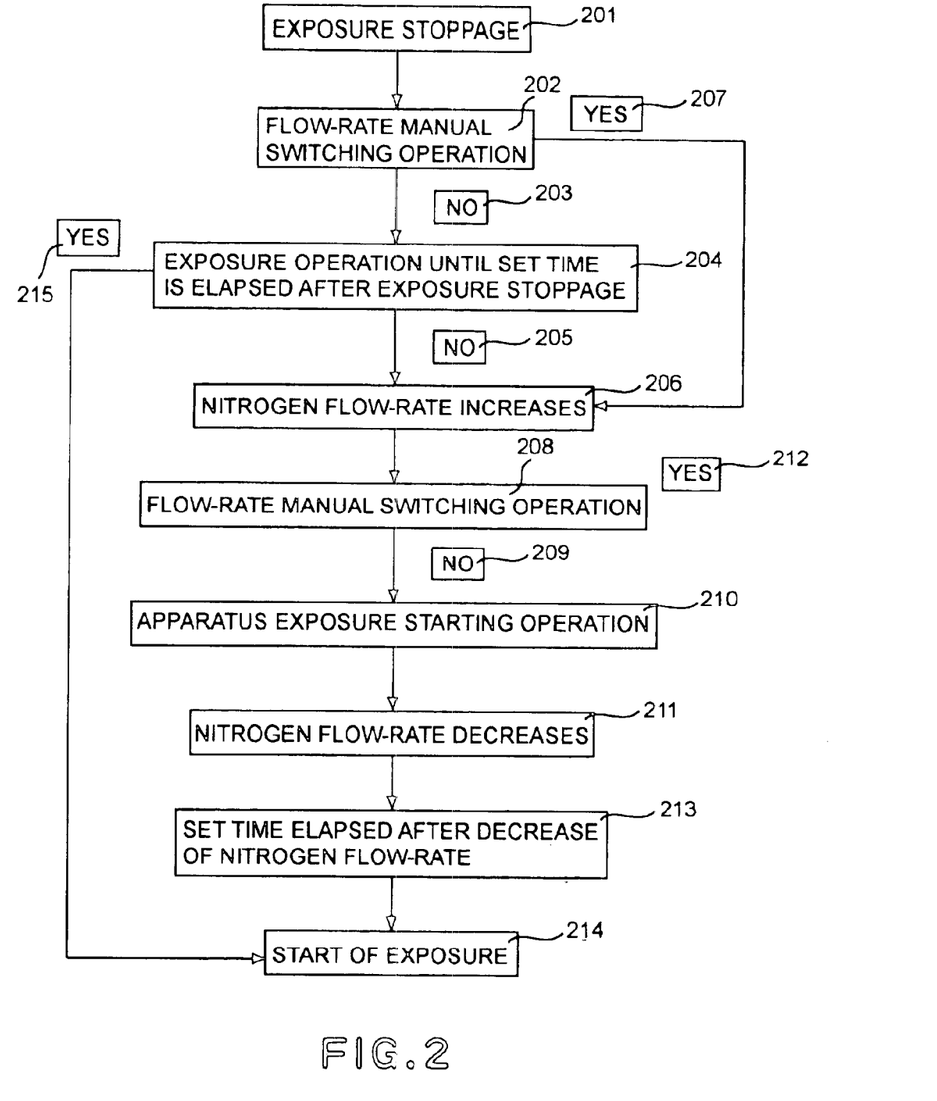
FIG. 2 is a flow chart for explaining the sequence of a flow rate switching operation in the first embodiment of the present invention.

With the structure described above, the nitrogen supply flow rate in the non-exposure period can be made large, as compared with the exposure period. As a result, the emission of gases from structural components inside the casing 7 can be exhausted in less time. Additionally, since the nitrogen supply amount is decreased during the exposure period, the amount of impurities passing along the optical component surface per unit time, during the exposure period, does not increase. Further, there is an automatic switching mechanism with which the flow rate is changed after absence of exposure for a predetermined time is confirmed. This excludes the possibility of a frequent flow-rate change during a normal device printing operation. Furthermore, because the manual switching mechanism is provided, the flow rate increase/decrease can be switched without waiting for the elapse of a predetermined time (as in an automatic switching process) if a long non-operation time of the exposure apparatus or the timing for starting the exposure apparatus held in a non-operation state is predetermined. With these procedures, the flow rate can be changed efficiently without a decrease of throughput, and the emission of gas inside the purge area can be exhausted quickly. FIG. 2 is a flow chart illustrating the switching operation described above (steps 201–215).

[Second Embodiment]

Figure 3:
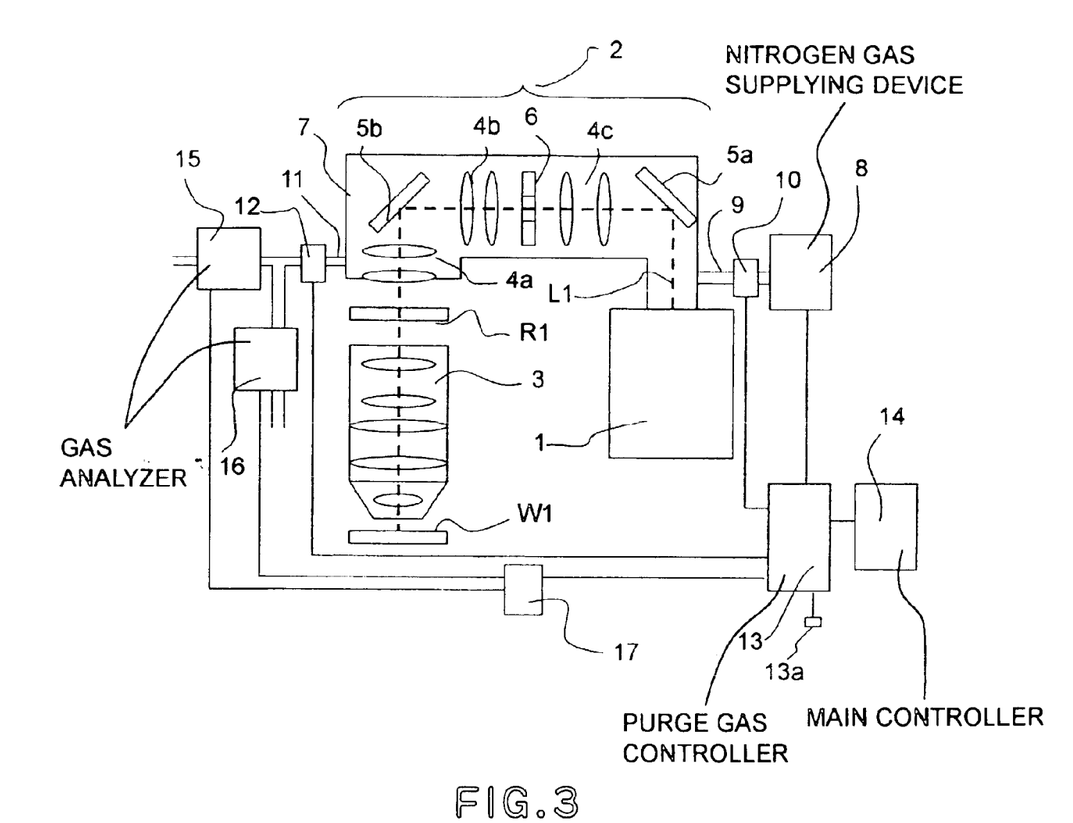
FIG. 3 is a schematic view for explaining the structure of an exposure apparatus according to a second embodiment of the present invention.

FIG. 3 shows an exposure apparatus according to a second embodiment of the present invention. The elements having the same functions as those of the FIG. 1 embodiment are denoted by like numerals, and a description thereof is omitted. The difference of this embodiment from the first embodiment will be described. In the first embodiment, in the exposure period and the non-exposure period, the nitrogen flow rate to be supplied is controlled to constant values set beforehand. In the second embodiment, on the other hand, gas analyzers 15 and 16 are connected to the nitrogen outlet port, and obtained values are fed back to calculate optimum nitrogen flow rates for the exposure period and the non-exposure period such that the flow rate is controlled with respect to these values.

Referring to FIG. 3, details will be explained. In FIG. 3, the basic structure is the same as that shown in FIG. 1. However, although in FIG. 1 the nitrogen passed through the casing 2 is exhausted from the outlet port, in the FIG. 3 embodiment, an organic-matter gas analyzer 15 and an inorganic-matter gas analyzer 16 are provided at the outlet port. The values from these analyzers are applied to a flow-rate calculating function 17. The flow-rate calculating function 17 receives measured values of the two gas analyzers as well as information regarding the nitrogen supply amount at that moment applied from the purge gas controller, to calculate optimum flow rates for the exposure period and the non-exposure period on the basis of the received information.

Figure 4:
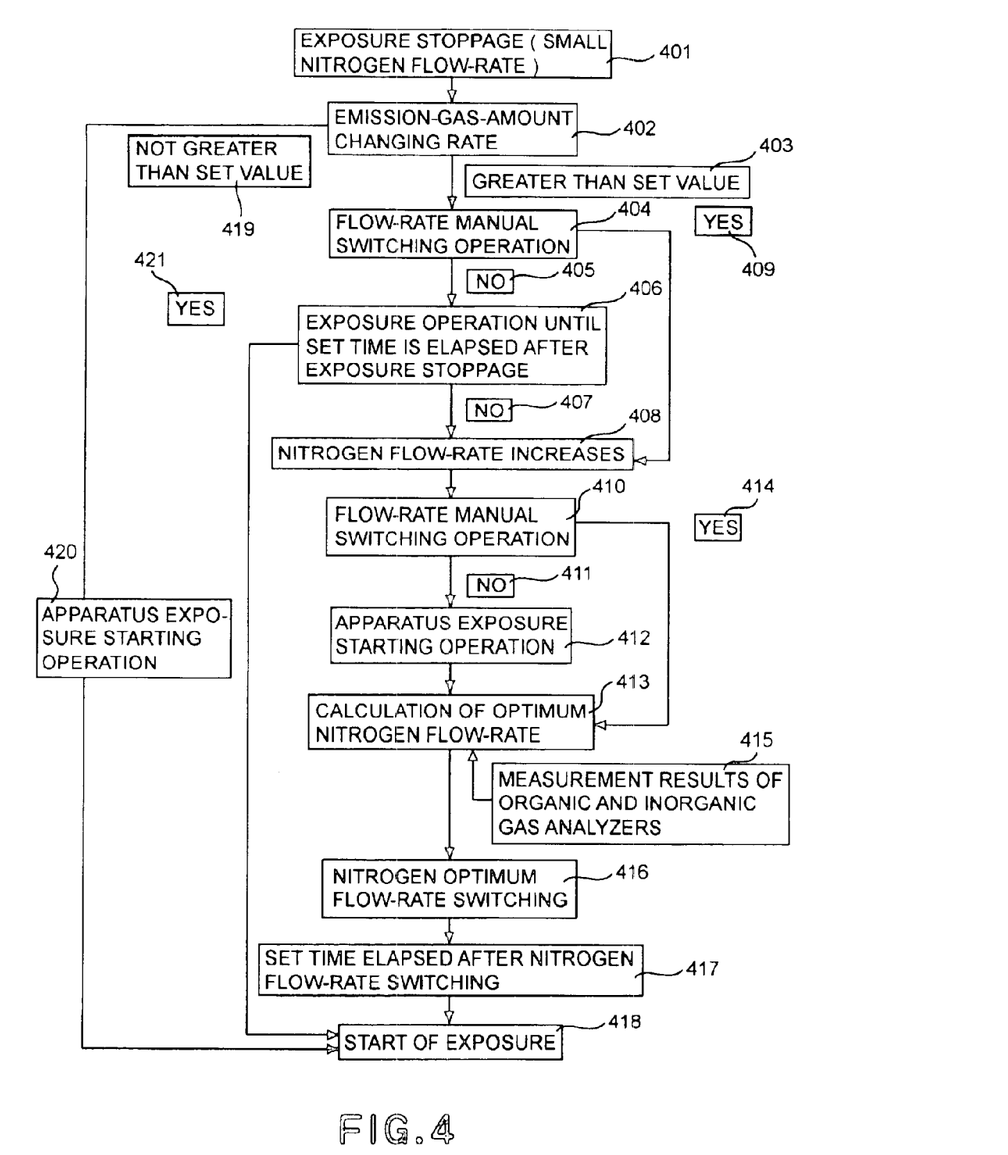
FIG. 4 is a flow chart for explaining the sequence of a flow rate switching operation in the second embodiment of the present invention.

The flow rate for the exposure period is calculated so that the total amount of organic and inorganic impurities passing through the casing 3 per unit time becomes smallest. As regards the flow rate for the non-exposure period, as long as the inside emission gas quantity is decreasing, a largest flow rate that can be determined in accordance with the gas supply and exhaust capacity, the pressure tightness of the casing, the gas cost, and the like, is supplied. However, if the changing amount of the gas analyzer per unit time becomes lower than a certain level having been set beforehand (i.e., emission of gas is exhausted), the flow-rate calculating function 17 determines that the gas supply amount should not be increased during the non-exposure period. The flow rate calculated by the flow-rate calculating function 17 is applied to the purge gas controller 13, such that the flow rate is controlled to provide an optimum nitrogen supply for both of the exposure period and non-exposure period. With the structure of the second embodiment described above, not only is the amount of impurity deposition during the exposure period reduced, but also, unnecessary nitrogen flow during the non-exposure period is avoided. FIG. 4 is a flow chart, illustrating the switching operation described above (steps 401–421).

[Third Embodiment]

Figure 5:
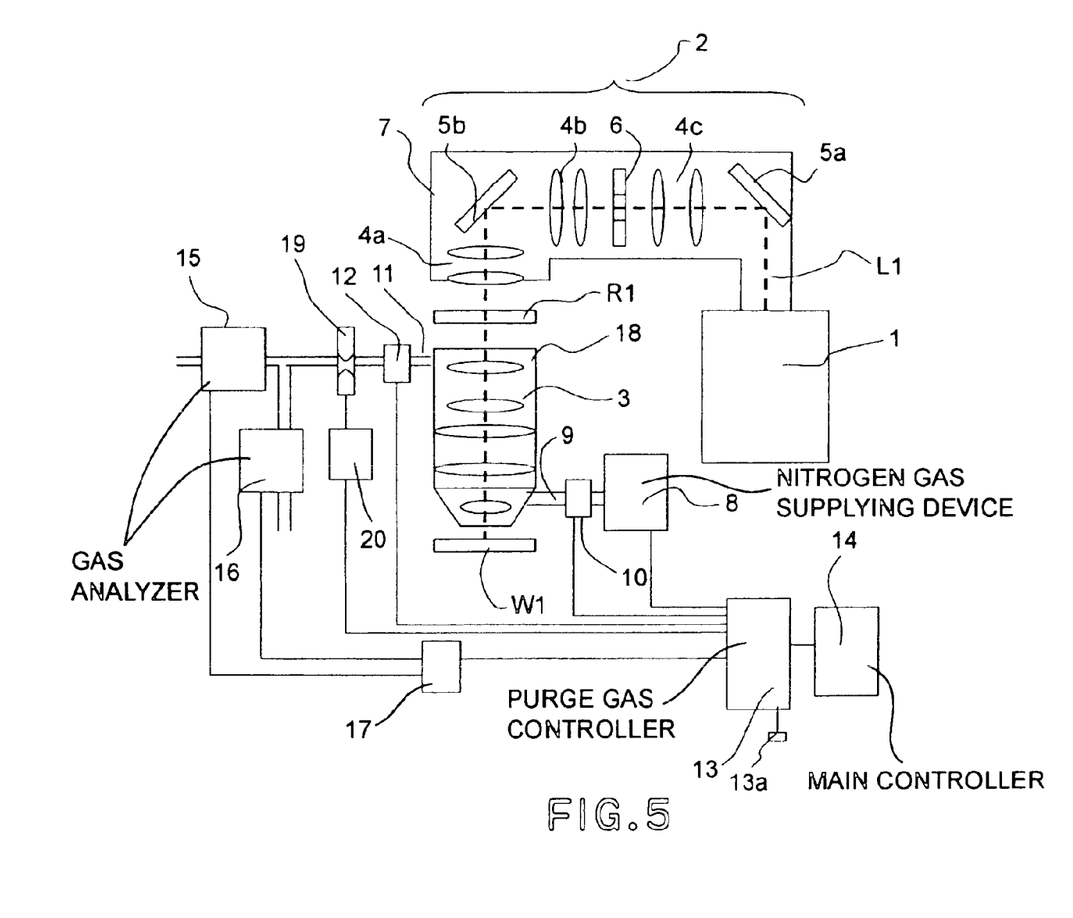
FIG. 5 is a schematic view for explaining the structure of an exposure apparatus according to a third embodiment of the present invention.

FIG. 5 shows an exposure apparatus according to a third embodiment of the present invention. The elements having the same functions as those of the FIG. 3 embodiment are denoted by like numerals, and a description thereof is omitted. The difference of this embodiment from the second embodiment will be described. In the second embodiment, the light source lens system is purged by nitrogen. In the third embodiment, on the other hand, a projection lens system is purged by nitrogen. In the case of a projection lens system, as compared with a light source lens system, any change in inside pressure will have a large influence upon the image performance such as magnification or distortion. In consideration of this, a variable restriction 19 is provided in a gas exhaust line 11 to change the piping resistance at the nitrogen outlet port in accordance with the nitrogen supply amount, thereby preventing a change in inside pressure (gauge pressure) due to a change in flow rate, caused when the optimum control for the purge gas flow rate during the exposure period is performed, as in the second embodiment.

Referring to FIG. 5, details will be explained. In FIG. 5, the basic structure is the same as in the second embodiment. As with the light source lens system 2, the projection lens system 3 comprises inside optical components, the outside of which is enclosed by a tightly closed structure 18. With a similar system as in the second embodiment, nitrogen is supplied into the structure. Thus, during the exposure period, the nitrogen flow rate is controlled to an optimum level, while monitoring the outlet impurity amount by use of an organic-matter gas analyzer 15 and an inorganic-matter gas analyzer 16. If the outlet port still has a similar structure as in the second embodiment to change the flow rate during the exposure period, the pressure inside the casing 18 changes such that the pressure of nitrogen between lenses of the projection optical system changes. This causes a change in the refractivity between the lens and the nitrogen. Such change in refractivity causes a phenomenon that the shape of an image printed becomes uneven or the size thereof changes, and also, the best focus position shifts. These changes can be disregarded in the case of a light source lens system as in the second embodiment. However, as regards a projection lens system of a semiconductor exposure apparatus, since the precision and reproducibility on an order of several tens of nanometers to a few nanometers are required, the amount of change described above cannot be disregarded.

In this embodiment, a variable restriction 19 is provided in the gas exhaust line 11. The opening/closing amount of the restriction 19 is controlled by means of a restriction controller 20 for controlling the opening/closing of the restriction 19. The restriction controller 20 is connected to a purge gas controller 13 and, from the controller 13, it receives information regarding the flow rate of nitrogen being supplied therefrom. Generally, if there is a restriction in the flowpassage of a fluid, among the flow rate, the restriction area, and the pressure, there is a relation that the flow rate is proportional to the product of the restriction area and the square root of the pressure. On the basis of this property, if the pressure is to be made constant, the restriction area may be changed by a ratio corresponding to the ratio of the changed flow rate. The restriction controller 20 as the same receives information from the purge gas controller 13, regarding the flow rate, controls the variable restriction 19 at the outlet port so as to change its area in accordance with the nitrogen supply amount at that moment. With this arrangement, a nitrogen purge system similar to the second embodiment can be applied to a projection lens system 3, which is very sensitive to a pressure change.

[Fourth Embodiment]

In the embodiments described above, the system may be provided with heating means for heating the purge gas to be supplied. By heating the purge gas to be supplied, emission of gases from components inside the closed space is accelerated, so that gas emission can be exhausted in a shortened period.

[Fifth Embodiment]

Next, an embodiment of a device manufacturing method, which uses an exposure apparatus according to any one of the embodiments described above, will be explained.

Figure 6:
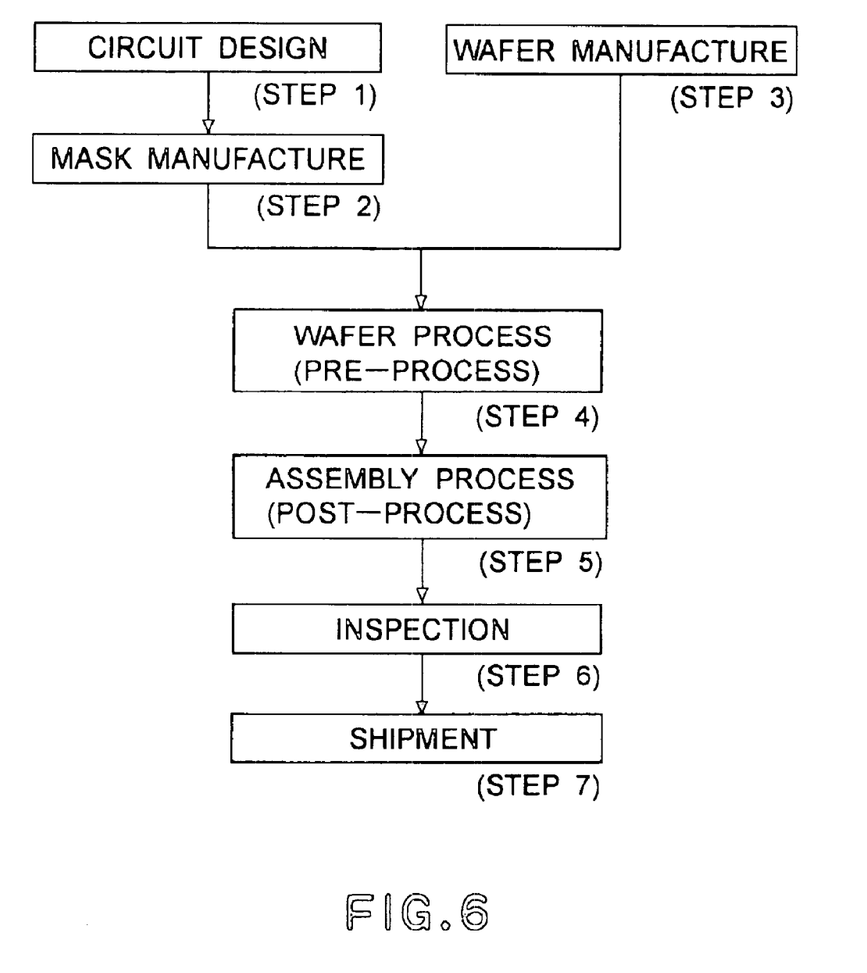
FIGS. 6 and 7 are flow charts, respectively, for explaining the procedure of device manufacture according to an embodiment of the present invention.

FIG. 6 is a flow chart for explaining the procedure of manufacturing various microdevices, such as semiconductor chips (e.g., ICs or LSIs), liquid crystal panels, CCDs, thin film magnetic heads, or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 7:
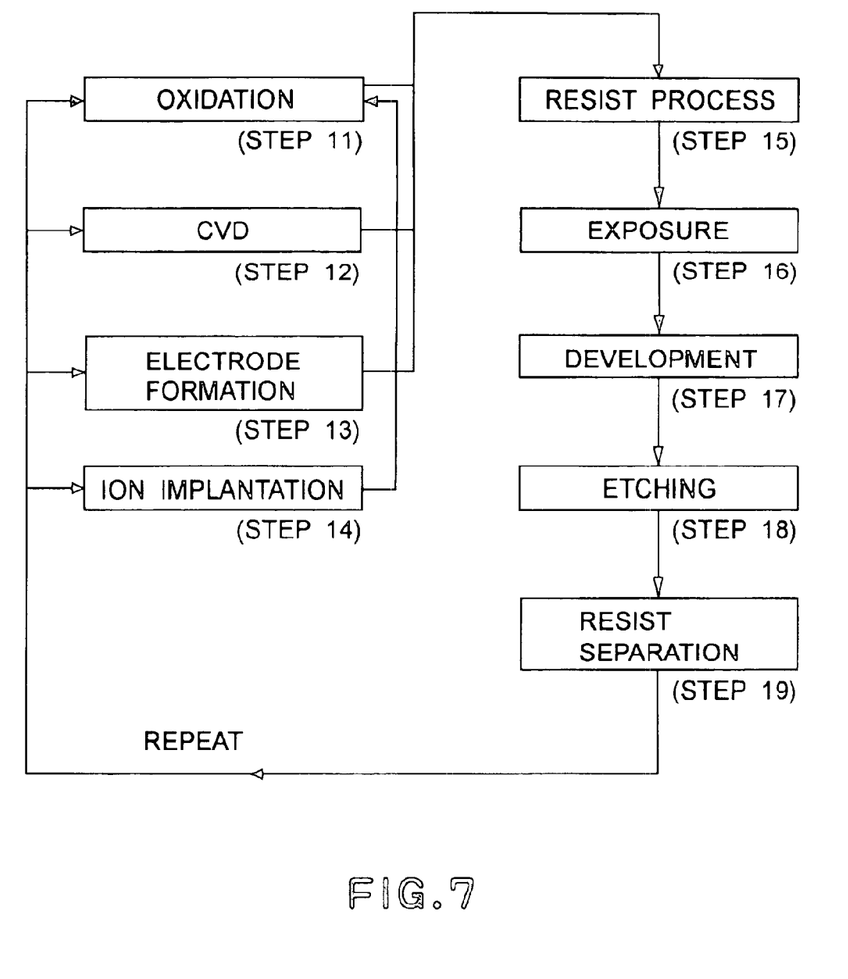

FIG. 7 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the present invention, adhesion of impurities onto optical components inside a semiconductor exposure apparatus can be reduced to a minimum, and an impurity producing source inside an inactive-gas purge space can be exhausted in a shortened time period without avoiding a decrease of illuminance. Since a high exposure illuminance can be maintained, high-precision and stable exposure amount control can be accomplished without degrading the productivity of the exposure apparatus. Thus, a fine pattern can be projected efficiently and stably.

While the invention has been described with reference to the structures disclosed herein, it is not confined to the details set forth, and this application is intended to cover such modifications or changes as may come within the purposes of the improvements or the scope of the following claims.

What is claimed is:

1. An exposure apparatus, comprising:
    an exposure light source;
    an optical system which directs exposure light from said exposure light source to a photosensitive substrate;
    a casing which accommodates therein at least one optical element of said optical system;
    a gas replacing system which supplies a purge gas into said casing to replace a gas inside said casing with the purge gas; and
    a control system which controls said gas replacing system so as to increase a flow rate of the purge gas if a predetermined time elapses after an exposure is completed and before a next exposure starts.

2. An apparatus according to claim 1, wherein said exposure light source comprises an excimer laser.

3. An apparatus according to claim 1, wherein the purge gas is an inactive gas.

4. A device manufacturing method, comprising the steps of:
    exposing a photosensitive substrate to a pattern by use of an exposure apparatus including: an exposure light source, an optical system which directs exposure light from the exposure light source to a photosensitive substrate, a casing which accommodates therein at least one optical element of the optical system, a gas replacing system which supplies a purge gas into the casing to replace a gas inside the casing with the purge gas, and a control system which controls the gas replacing system so as to increase a flow rate of the purge gas if a predetermined time elapses after an exposure is completed and before a next exposure starts; and
    developing the photosensitive substrate exposed in said exposing step.

* * * * *